United States Patent [19]

Jenss et al.

[11] Patent Number: 5,740,002
[45] Date of Patent: Apr. 14, 1998

[54] ELECTRONIC LOAD RELAY FOR MOTOR VEHICLES

[75] Inventors: Volker Jenss; Petrik Lange, both of Lippstadt, Germany

[73] Assignee: Hella KG Hueck & Co., Lippstadt, Germany

[21] Appl. No.: 449,670

[22] Filed: May 24, 1995

[30] Foreign Application Priority Data

May 31, 1994 [DE] Germany .................. 44 19 005.0

[51] Int. Cl.⁶ .................................................. H02H 3/00
[52] U.S. Cl. ............................ 361/93; 361/723; 257/675
[58] Field of Search ..................... 361/56, 111, 212, 361/220, 723, 93; 257/675

[56] References Cited

U.S. PATENT DOCUMENTS 4,617,605 10/1986 Obrecht et al. ..................... 361/220
4,879,633 11/1989 Kaufman ............................ 361/723

FOREIGN PATENT DOCUMENTS

| 2 252 018 | 5/1973 | Germany . |
|---|---|---|
| 33 06 120 A1 | 8/1984 | Germany . |
| 93 07 386.0 | 9/1993 | Germany . |
| 59-72757 | 4/1984 | Japan . |
| 63-87757 | 4/1988 | Japan . |
| 5-299576 | 11/1993 | Japan . |

OTHER PUBLICATIONS

Motorola Inc., SSR Solid State Relay; Undated Customer Reference Brochure, undated.
Zettler; Das Programm nach Maβ Füralle Anwendungsbereiche; 19/91 Advertisement.

Primary Examiner—Jeffrey A. Gaffin
Assistant Examiner—Sally C. Medley
Attorney, Agent, or Firm—Griffin, Butler, Whisenhunt & Kurtossy

[57] ABSTRACT

An electronic load relay which can be manufactured in an uncomplicated and cost effective manner can, because of an arrangement of its contact-plug parts, replace an electromechanical load relay. This invention particularly solves the problem of heat dissipation from an electronic power switch in a beneficial manner by having an electronic power switch thermally and electrically directly coupled to a metallic wiring support, or board, which forms a plug contact assembly.

13 Claims, 4 Drawing Sheets

# 5,740,002

1

ELECTRONIC LOAD RELAY FOR MOTOR VEHICLES

BACKGROUND OF THE INVENTION

This invention relates generally to an electronic load, or on-load, switch (relay) including an electronic power switch and an integrated control circuit formed as a solid state relay.

With electromechanical load switches being increasingly replaced by electronic load switches, circuit arrangements of a type comprising an electronic solid state switch (transistor, thyristor), a control circuit, and, optionally, additional wiring with passive components, have come into use.

Substitutions for electromechanical load switches with electronic switches have taken place mainly in electronic control devices in which electromechanical load switches have been replaced by electronic circuit parts on wiring boards (for example, printed circuit boards).

An electromechanical relay for a motor vehicle which has a plug contact part and an encapsulated structure represents an independent component part which can be electronically and mechanically coupled via a corresponding oppositely engaging contact part on a desired place of a motor vehicle. Known state-of-the-art electronic power switches, are not compatible with such "stand alone" relays (potted relays).

Various structures of independent solid state relays are shown in a title page of a prospectus "Halbleiter-Relais, 10/91, Produktübersicht; Das Programm nach Maβ für alle Anwendungsbereiche" of the firm Zettler. One of the structures shown there is a solid state relay, as a wired component which can be soldered to a circuit board. In another embodiment a housing of a solid state relay has screw clamps with which the solid state relay can be coupled to electronic leads.

The prospectus "SSR Solid State Relay; 1993, Customer Reference Brochure" of the firm Motorola shows an electronic load relay for use in motor vehicles in which the load relay is arranged inside a relatively large-volume metallic housing for which a flange-like surface is provided for contacting a heat-sink-acting metallic part (for example a motor block). Electronic contacts for this electronic load relay result via a plurality of flat-plug connections.

In this state-of-the-art load relay circuit, parts are mounted inside the housing on an electronic-insulation board, or carrier (for example a circuit board or a hybrid ceramic). Such a construction of a load relay is also described in supporting material of Gebrauchsmusteranmeldung G 93 07 386.

It is detrimental, in this regard, that these exterior contacts are achieved via contact elements which, in general, are only slightly thermally engaged, or not thermally engaged at all, with the electronic power switch. Cooling bodies, which are electrically insulative and thermally conductive, are coupled with the power switch for cooling it.

Heat transmission from the electronic power switch results firstly via an insulative mounting plate on the housing and the heat is, from there, dissipated to the environment via large surface cooling members or to a metallic heat sink coupled to the housing (for example the motor block).

It is an object of this invention to provide an electronic on-load relay which is so constructed that it can be produced in an uncomplicated, cost effective manner to have a small profile structure and to be suitable for directly replacing prior electromagnetic on-load relays without a change in external connections of the on-load relay being necessary.

SUMMARY OF THE INVENTION

According to principles of this invention, an electronic power switch and an integrated control circuit are mounted on a primarily two-dimensionally constructed, non-insulating metallic wiring support and they are electrically coupled with the wiring support, the metallic wiring support forming external coupling terminals which are typical motor vehicle plug contacts.

BRIEF DESCRIPTION OF THE DRAWING

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
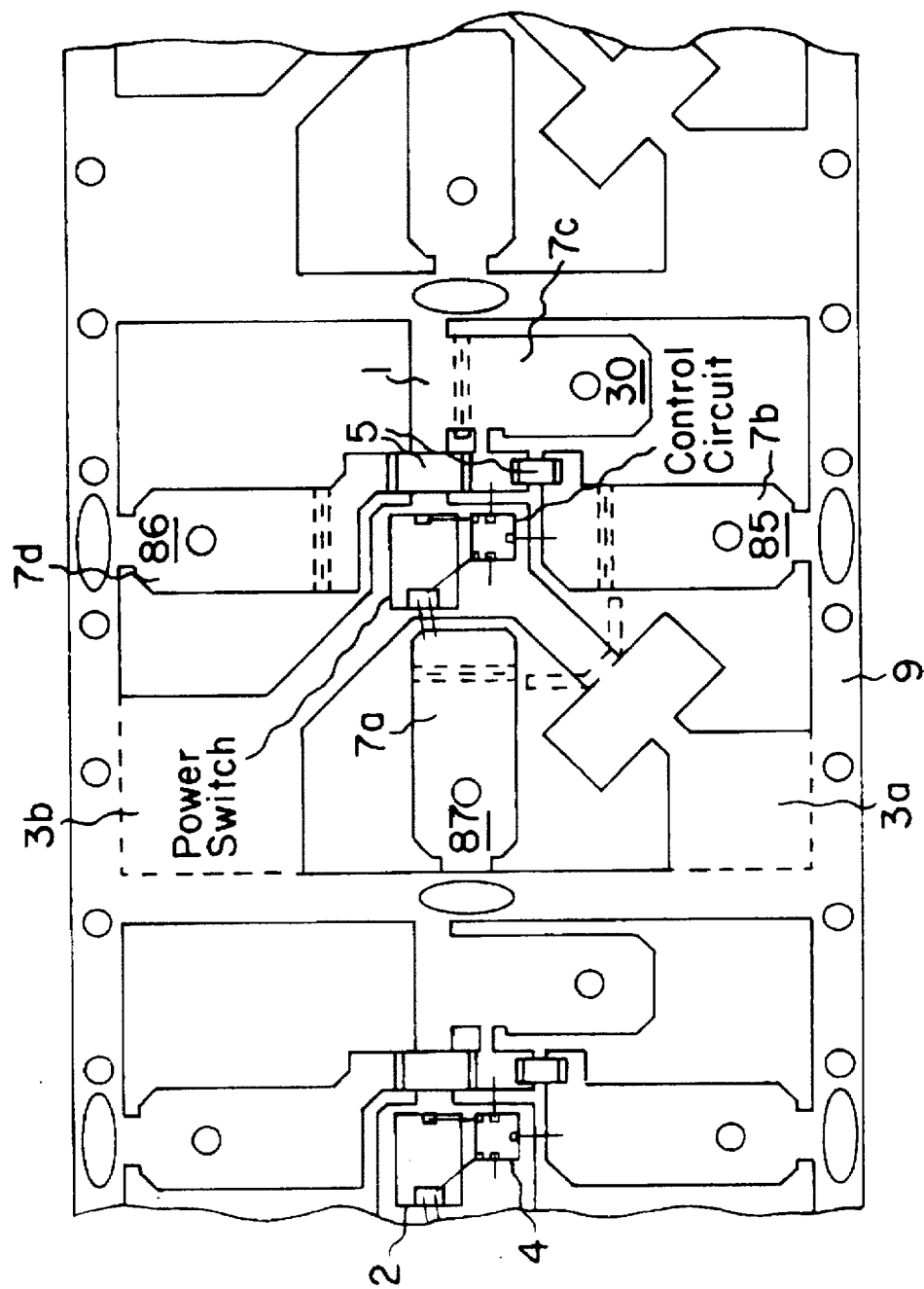
FIG. 1 is a top view of an electronic load relay with a plug contact design according to DIN ISO 7588, when it is not in a housing.

The component arrangement of an electronic load relay according to this invention shown in Fig. 1 includes a wiring support 1 which is worked to have a primarily two dimensional structure by a mechanical (frame stamping) or wet chemical (etching) process. The structure includes conductive bands, or paths, for electrical connections from circuit components 2, 4, 5, terminal lugs 7a, 7b, 7c, 7d as well as cooling sheet metal 3a, 3b. The mentioned structural elements of the metallic wiring support 1 are held in their positions by an outer frame 9. This outer frame 9 also serves as a transport strip (for example during a stamping process) when the wiring support 1 is being formed.

The electrical and electronic circuit components 2, 4, 5 are mounted on the structural elements of the metallic wiring support by solder, conductive adhesive, or the like, and are in direct electrical and thermal contact with the wiring support.

Further electrical couplings of the circuit components 2, 4, 5 among themselves are provided via bond couplings.

The heat-generating and also heat sensitive active components, namely, the electronic power switch 2 (manifested for example as a power-FET-transistor) and the control circuit 4 for the power switch 2 are mounted on the largest possible surface portion of the metallic wiring support. This portion forms also two cooling surfaces of metallic cooling members 3a, 3b which also increases a volume, and thereby a heat capacity, of this portion of the metallic wiring support. In this manner, large amounts of heat which appear for short durations at the electronic power switch upon impulse loads of the load relay, could be easily accommodated by the metallic wiring support 1. The metallic cooling members 3a, 3b bring about also, via their large surfaces, a very good thermal coupling of the wiring support 1 with a housing of the load relay so that, upon long duration loads of the load relay, produced heat can be conducted away on housing material and dissipated by radiation or convection from its exterior surface.

Production of the housed load relay shown in the segmented representation in FIG. 2, from the arrangement depicted in FIG. 1, takes place as follows:

The metallic cooling members 3a, 3b are punched free of the surrounding frame and, in the same work step, respectively bent downwardly and upwardly so that the metallic cooling members 3a, 3b are substantially parallel to the surface of the original frame and are thereby arranged over and below the circuit components 2, 4, 5. Thereafter, the circuit components 2, 4, 5 and the metallic cooling members 3a, 3b are sprayed with a resinous plastic spray. Finally, the terminal lugs 7a, 7b, 7c, 7d are stamped free of the surrounding frame 9 and are bent at the areas of the multiple dashed lines.

Figure 2:
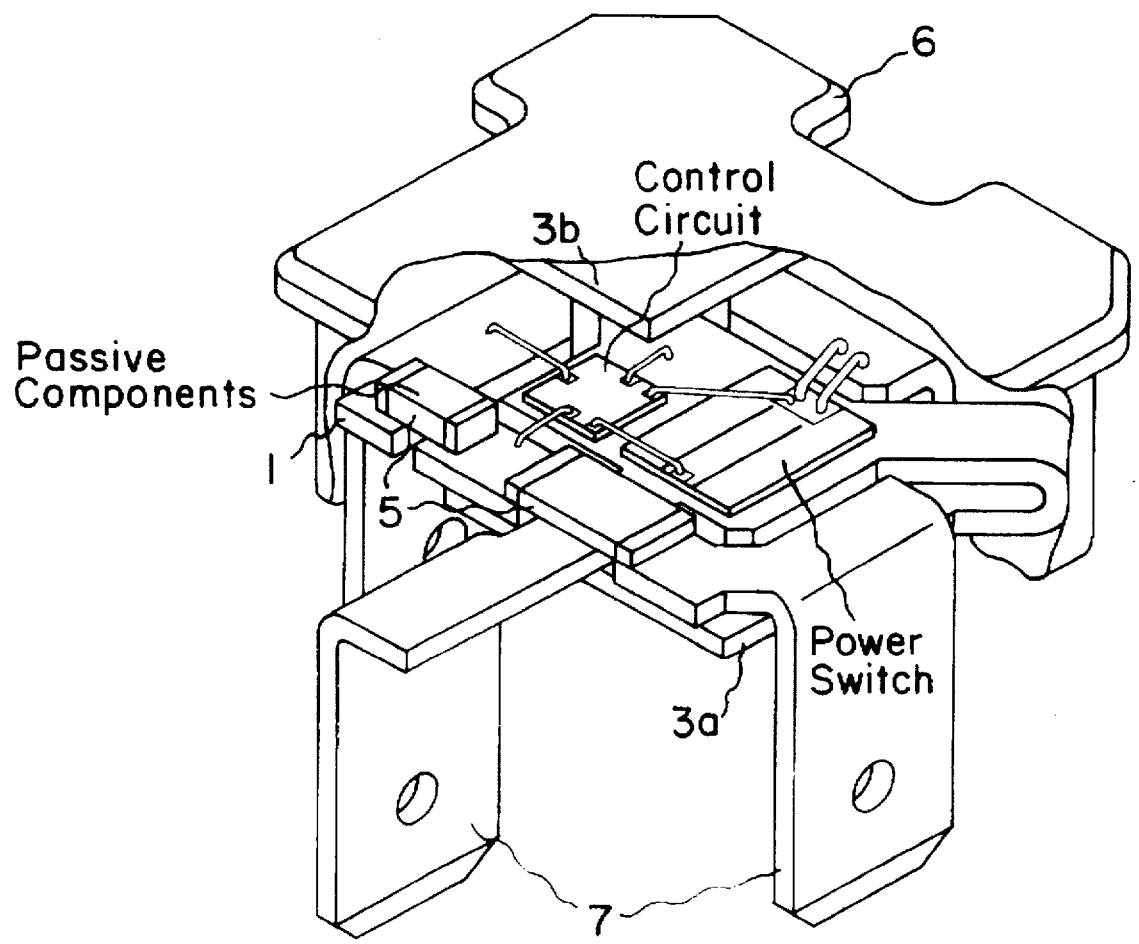
FIG. 2 is a partially cutaway isometric view of an electronic load relay corresponding to the electronic load relay of FIG. 1 in a final packaged arrangement.

A cutaway isometric of the thusly prepared load relay is shown in FIG. 2.

The metallic cooling members 3a, 3b can be recognized beneath and above a base surface of the metallic wiring support 1 on which (as is shown here only schematically) the circuit components are arranged. One must imagine that the interior of the plastic housing 6 is completely filled with plastic.

The terminal lugs of the overall load relay form a plug contact part 7 at its underside, which is constructed in accordance with terminal plug design DIN ISO 7588 as is standard for particular electromagnetic load relays so that an electronic load relay according to this invention can be used as a replacement for a corresponding electromagnetic load relay without employing special measures.

The described embodiment of the electromagnetic load relay of this invention achieves an extremely compact structure and provides effective measures against thermal overload.

Figure 3:
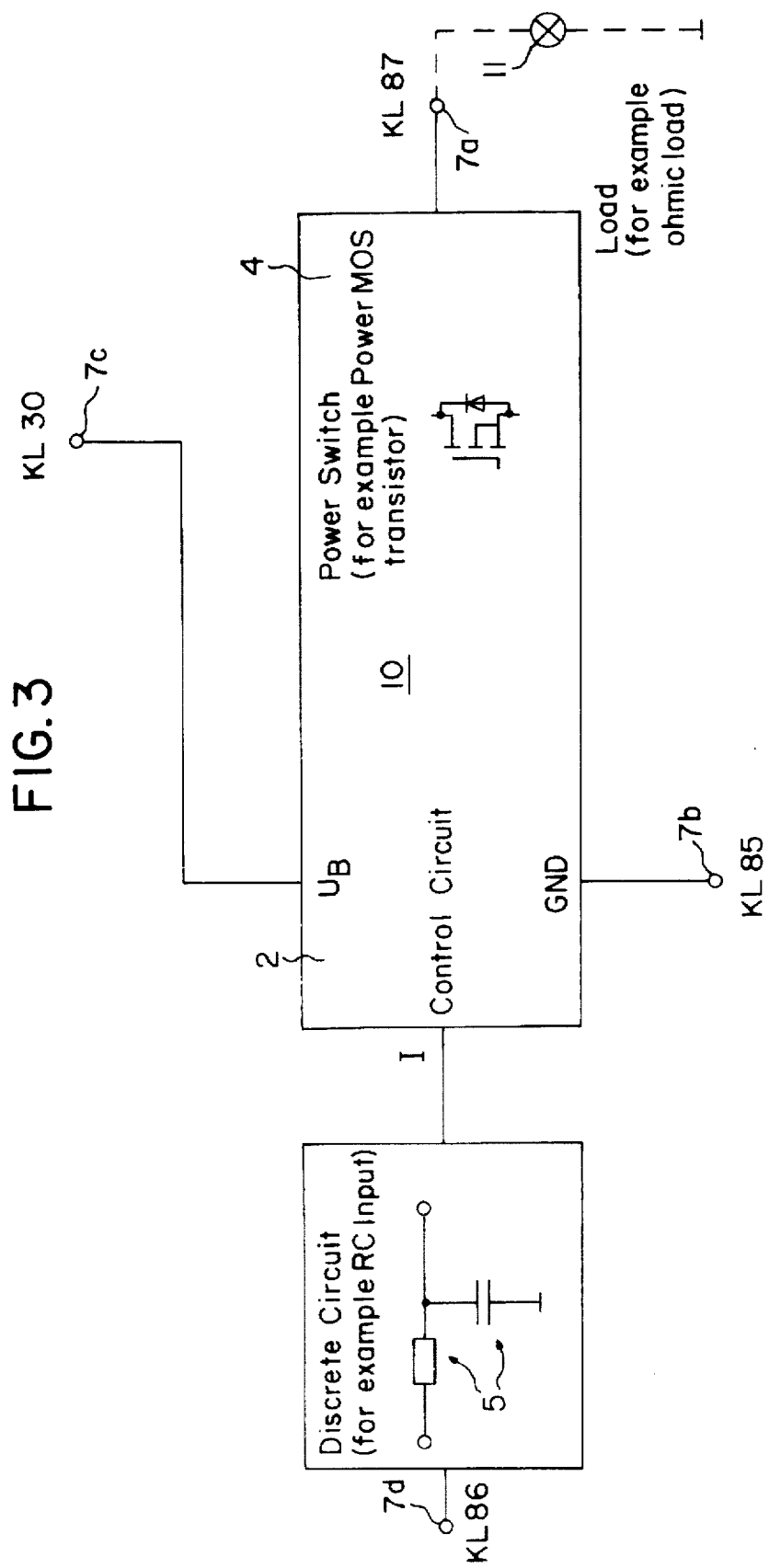
FIG. 3 is a block schematic diagram of the electronic wiring of the load relay shown in FIG. 1.

The functioning of such an electronic load relay, which is well known, is, with the use of FIG. 3, briefly outlined. The terminals shown in FIG. 3 are numbered 30, 85, 86, and 87 to more readily allow a comparison with the arrangement of FIG. 1, on which the terminal lugs 7a, 7b, 7c, 7d can again be found, which correspond to the motor vehicle plug specifications according to DIN 350 7588.

The control circuit 4 and the electronic power switch 2 are combined here to form a combined circuit block 10 which is coupled between a vehicle supply voltage (UB) and a vehicle ground (GND).

By control with a predetermined potential at an input terminal (I), the combined circuit block 10 switches the electrical load 11 to the main vehicle supply voltage UB.

A preliminary resistor and a condenser are coupled as passive components to an input lead I for reducing disturbances.

Figure 4:
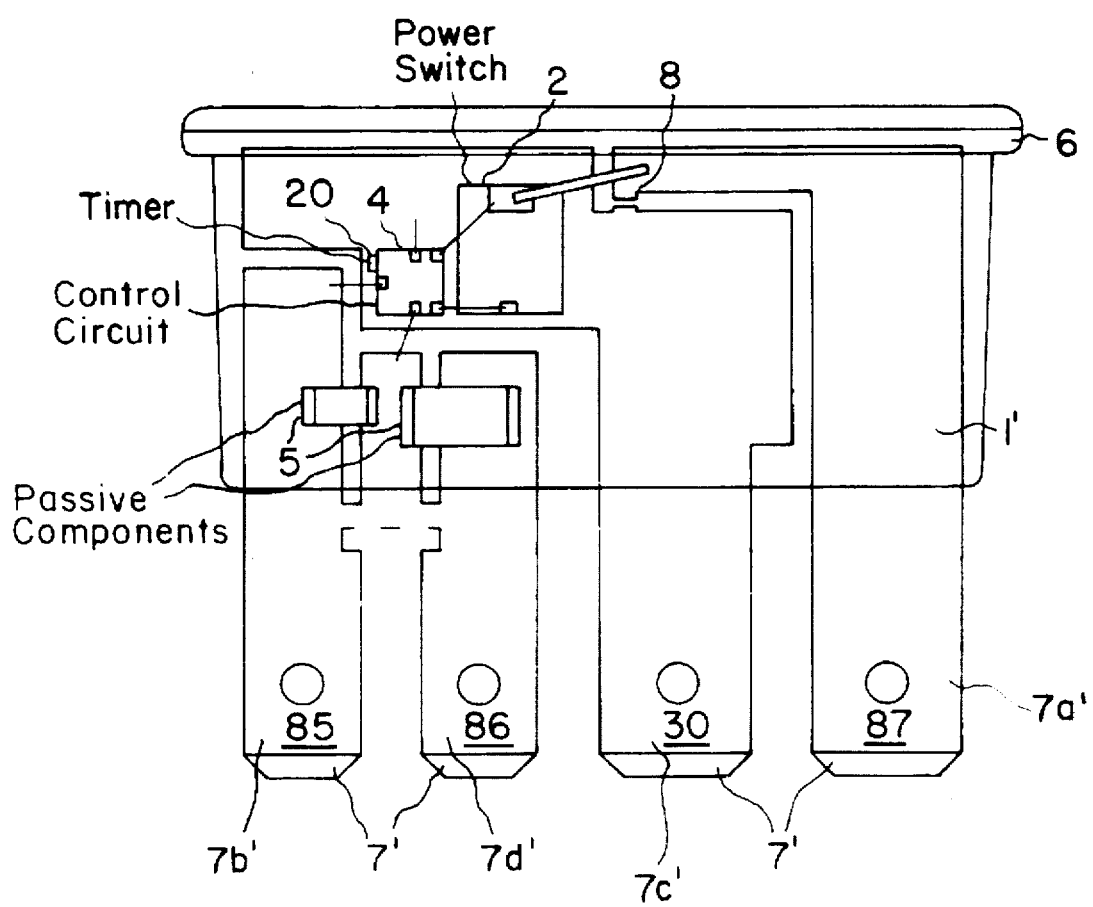
FIG. 4 is a side view of an electronic load relay with a non-standard single-inline-connection design.

Another embodiment of an electronic load relay of this invention is shown in FIG. 4.

This embodiment also has a plug design which is typical for motor vehicles (so called single-inline-arrangement which is known for motor vehicle fuses), which, however, until now, has not normally been used for relays.

The depicted load relay distinguishes itself by having four flat plugs which are arranged in a row, by which the load relay can have a particularly narrow shape.

Further, the arrangement of the wiring support 1', and the circuit components 2, 4, 5 arranged thereon, is similar to the arrangement depicted in FIG. 1. Thus, the wiring support 1' of the load relay shown in FIG. 4 preferably has three dimensional metallic cooling members, which, however, are not shown in FIG. 4.

As a further feature, the structure of the wiring support 1' has, between terminal lugs 7a', 7c', a spark gap 8 as an overvoltage protection for the electronic circuit parts against turn-off pulses of conductive loads and against externally-created electrostatic discharges. The electrodes of this spark gap are, for example, formed of a separated lead path coupling between the terminal lugs 7a', 7c' of the wiring support 1.

In order to achieve the least possible spacing of the electrodes for the spark gap 8 a thin passage-formed break can be made in the wiring support 1 by a laser beam.

By reducing path cross sections of the wiring support 1, further resistors for limiting current in the control and load circuits can be realized so that separately constructed components 5 can at least be partially isolated. In addition to bringing about a two dimensional structure, a stamping process can also create resistances by reducing conductive path cross sections.

A load relay of this invention can also be beneficially further developed, in an uncomplicated manner, into an electric blinker unit whereby, by adding a timing circuit (20 FIG. 4) to the control circuit 4, it also exhibits the desired benefits of this invention, particularly the uncomplicated and cost effective possibility of replacing existing electromechanical blinker units with this electronic blinker unit. A load control (for example for detecting lamp failures) can be achieved in the control circuit by measuring load current passing through the power switch.

The electronic load relay constructed according to this invention has many beneficial aspects.

The electronic load relay is particularly uncomplicated in structure because the wiring support mechanically supports and also is electrically coupled to the electronic power switch as well as to the control circuit which are mounted thereon.

It is also beneficial that the metallic wiring support simultaneously forms exterior terminals which are shaped as plug contact parts and thereby provide terminal contacts for energizing and otherwise supplying the load relay.

Heat which occurs in the electronic power switch is led away via these terminal contacts and via supply plugs connected to these terminal contacts in a particularly beneficial manner. This is particularly possible because of the direct thermal coupling of the power switch to the wiring support. In this regard, it is beneficial that no further insulating supporting part is necessary (such as a printed circuit board or a hybrid ceramic).

The metallic wiring support can be constructed in a particularly uncomplicated, quick and cost effective manner by blanking, or punching, it out of a strip of wiring-support material. When this is done, it is particularly beneficial that, by employing commercial efficiency, many wiring supports can be manufactured, as well as finished, at the same time.

A further benefit is that the housing of the load relay of this invention can be manufactured in an uncomplicated manner by spraying the wiring support and the components mounted thereon with a resinous plastic material.

In this manner, a particularly compact construction of a load relay is possible which is even superior to the compactness of an equivalent electromechanical power switch.

Because of this, the load relay of this invention is suitable for replacing conventional electromechanical load relays.

especially in a particularly beneficial manner if a plug-contact-part assembly of the load relay is compatible to be coupled with a standard receptacle-contact-part assembly for electromechanical load relays. In this manner, no change in the contacts is necessary when an electromechanical load relay is replaced by an electronic load relay. Particularly, an electronic load relay of this invention can be placed in an existing opposite contact-part assembly for an electromechanical load relay.

Because when a load relay of this invention is mounted in an opposite existing contact-part assembly, heat dissipation via a mounting plate constructed as a cooling body is not available, it is beneficial that in the load relay of this invention additional heat dissipation is provided in that at least a part of the metallic wiring support on which the electronic power switch is mounted has cooling members thereon with cooling surfaces which, by being bent above and below the component supporting surface of the wiring support, form three dimensional cooling surfaces which then better distribute heat from the wiring support to the resinous-plastic spray coating.

Further, the cooling surfaces formed thereon increase the heat capacity of the wiring support so that a greater amount of heat can be received by the wiring support, which is a particular benefit for large, short-duration, loads (currents) on the electronic power switch.

In this regard, it is also beneficial that the wiring support, in addition to having good electrical conductivity, also has a relatively high heat capacity and, for example, is fabricated of copper.

It is also beneficial that further discrete components (particular passive components), can also be mounted on the wiring support and electrically coupled therewith in order to achieve particular circuit characteristics.

Also, with special embodiments of the wiring support, particular switching measures can be provided in a beneficial manner. For example, parts of the metallic wiring support can be electrically isolated from one another by placement of small spaces (for example by cutting with laser beams), with the spaces forming spark gaps, which protect the control circuit or the power switch from damaging voltage influences (caused by externally supplied electrostatic discharges or by induction voltages of inductive loads switched by the power switch).

Parts of the wiring support can also be formed as low-ohm resistors (for example by manufacturing and adding parts that are of a material differing from the rest of the wiring support or by changing the form or thickness of parts during a stamping process when the wiring support is manufactured). A voltage drop appearing on such parts can be used by the control circuit, for example, to monitor current of the load circuit and particularly to recognize short circuits. Depending on use, these can also have a current limiting function, serving as resistors formed as parts of the wiring support.

In a beneficial special case, the control circuit can also include an integrated timer and the load circuit can thereby form an electronic blinker unit. Increased expenses for a control circuit formed as a blinker unit control circuit are quite small.

The invention claimed is:

1. Electronic load relay for motor vehicles including a power switch and an integrated control circuit formed as a solid state relay, wherein the electronic power switch and the integrated control circuit are mounted on a two-dimensionally-structured, non-insulating, metallic wiring support so that they are electrically-conductively coupled to the metallic wiring support, wherein the metallic wiring support forms coupling terminals which are shaped to form an industry standard motor-vehicle plug contact assembly and wherein, the electronic power switch, the integrated control circuit and the metallic wiring support are embedded together in a resinous plastic material which supports these elements relative to one another.

2. Electronic load relay as in claim 1 wherein the coupling terminals of the standard motor-vehicle plug contact assembly are shaped to be compatible for being coupled with industry standard plug contact parts for electromechanical load relays.

3. Electronic load relay as in claim 1 wherein the metallic wiring support defines three dimensional cooling surfaces.

4. Electronic load relay as in claim 1 wherein electronic components are mounted on the wiring support in addition to the electronic power switch and the integrated control circuit and are electrically coupled to the metallic wiring support.

5. Electronic load relay as in claim 1 wherein the metallic wiring support is a blanked part.

6. Electronic load relay as in claim 1 wherein parts of the metallic wiring support form electronic resistors.

7. Electronic load relay as in claim 1 wherein the metallic wiring support is of copper.

8. Electronic load relay as in claim 1 wherein electrically separated path parts of the metallic wiring support form at least one spark gap which serve as overvoltage protection devices.

9. Electronic load relay as in claim 1 wherein a timer is integrated into the control circuit, with the electronic load relay being formed as an electronic blinker unit.

10. Electronic load relay for motor vehicles including a power switch and an integrated control circuit formed as a solid state relay constructed by the process of:
    preparing a metallic wiring support of a single, two-dimensionally-structured, metallic sheet by punching spaces in the metallic sheet so as to leave a frame attached to individual metallic parts separated by spaces;
    mounting the electronic power switch and the integrated control circuit on the metallic parts so that the electronic power switch and the integrated control circuit are electrically and thermally coupled to the metallic parts;
    covering the electronic power switch and the integrated control circuit, as well as portions of the metallic parts, with a resinous plastic material to form a housing for supporting the metallic parts and the electronic power switch and the integrated control circuit relative to one another, while leaving other portions of the metallic parts free of resinous plastic material for forming coupling terminals in the shape of plugs extending exteriorally of the resinous plastic material for being inserted into corresponding sockets; and
    cutting the metallic parts from the frame.

11. An electronic load relay as in claim 10 wherein is further included the steps of bending the plug contacts to form a plug contact assembly for fitting an industry standard socket.

12. A method of constructing an electronic load relay for motor vehicles including a power switch and an integrated control circuit formed as a solid state relay comprising the steps of:
    preparing a metallic wiring support of a single, two-dimensionally-structured, metallic sheet by punching spaces in the metallic sheet so as to leave a frame attached to individual metallic parts separated by spaces;

mounting the electronic power switch and the integrated control circuit on the metallic parts so that the electronic power switch and the integrated control circuit are electrically and thermally coupled to the metallic parts;

covering the electronic power switch and the integrated control circuit, as well as portions of the metallic parts, with a resinous plastic material to form a housing for supporting the metallic parts and the electronic power switch and the integrated control circuit relative to one another, while leaving other portions of the metallic parts free of resinous plastic material for forming coupling terminals in the shape of plugs extending exteriorally of the resinous plastic material for being inserted into corresponding sockets; and cutting the metallic parts from the frame.

13. A method as in claim 12 wherein is further included the step of bending the plug contacts to form a plug contact assembly for fitting an-industry standard socket.

* * * * *